United States Patent
Jo

(10) Patent No.: US 7,387,701 B2
(45) Date of Patent: Jun. 17, 2008

(54) ETCHANT FUME EXHAUST APPARATUS

(75) Inventor: Dong Yuel Jo, Daegu-si (KR)

(73) Assignee: LG. Philips LCD. Co., Ltd., Seoul (KR)

( * ) Notice: Subject to any disclaimer, the term of this patent is extended or adjusted under 35 U.S.C. 154(b) by 0 days.

(21) Appl. No.: 10/684,666

(22) Filed: Oct. 14, 2003

(65) Prior Publication Data

US 2004/0127039 A1    Jul. 1, 2004

(30) Foreign Application Priority Data

Dec. 30, 2002 (KR) ............ 10-2002-0086561

(51) Int. Cl.
*C23F 1/00* (2006.01)
*H01L 21/306* (2006.01)

(52) U.S. Cl. .................................. 156/345.18

(58) Field of Classification Search ........... 156/345.18, 156/345.29; 55/462, 463, 423; 137/312, 137/314; 96/302, 368, 396; 141/86; 165/111, 165/114; 261/108, 109, 126
See application file for complete search history.

(56) References Cited

U.S. PATENT DOCUMENTS

| 179,581 A | * | 7/1876 | Lyman ................. 55/442 |
| 264,093 A | * | 9/1882 | Maypole .............. 55/423 |
| 421,017 A | * | 2/1890 | Stein .................. 55/423 |
| 434,042 A | * | 8/1890 | Crawford ............. 55/446 |
| 657,748 A | * | 9/1900 | Scott ................. 55/423 |
| 3,526,082 A | * | 9/1970 | Thuillier ............. 96/302 |
| 4,385,912 A | * | 5/1983 | Parrick et al. ........ 55/329 |

FOREIGN PATENT DOCUMENTS

JP       11293479 A   * 10/1999
RU       2056177 C1   *  3/1996

OTHER PUBLICATIONS

English Machine Translation of JP-11-293479A. Obtained from http://www4.ipdl.ncipi.go.jp/cgi-bin/tran_web_cgi_ejje on Jan. 6, 2005.*

* cited by examiner

*Primary Examiner*—Parviz Hassbnzadeh
*Assistant Examiner*—Maureen G Arancibia
(74) *Attorney, Agent, or Firm*—Brinks Hofer Gilson & Lione

(57) ABSTRACT

An etchant fume exhaust apparatus is installed in a system performing an etching process during fabrication of LCDs. The etchant fume exhaust apparatus prevents the contamination and corrosion of the etching system by allowing both gaseous and liquid etchant to be discharged safely. The etchant fume exhaust apparatus includes an exhaust hole that provides a passage to discharge gaseous etchant, an exhaust plate located under the exhaust hole that collects condensed etchant dripping from the exhaust hole, a support part that fixes the exhaust plate to the exhaust hole, and an exhaust line connected to the bottom of the exhaust plate through which the etchant collected in the exhaust plate is removed from the exhaust plate.

27 Claims, 4 Drawing Sheets

ETCHANT FUME EXHAUST APPARATUS

This application claims the benefit of priority to Korean Patent Application 2002-86561, filed on Dec. 30, 2002.

BACKGROUND OF THE INVENTION

1. Field of the Invention

The present invention relates to a wet etching system, and more particularly, to an etchant fume exhaust apparatus installed in the etching system being used in an etching process for the fabrication of a liquid crystal display device, for discharging the etchant in a vapor and liquid state out of the system thereby to prevent the contamination and corrosion of the etching system.

2. Description of the Related Art

With the recent rapid development of the technologies in semiconductor device fabrication industries, improved liquid crystal display (LCD) device products are produced that are thinner and lighter. The CRT (cathode ray tube), being widely used for display devices until now, has advantages in functionality and price, but also has many disadvantages including difficulty in miniaturization and portability.

In contrast, LCD devices have many more advantages than CRTs, especially when it comes to mobile devices. These advantages include the ability to miniaturize the devices, the devices are comparatively lightweight, and have relatively low power consumption. LCD devices have become so common that they are replacing the conventional CRT devices, especially as they overcome the above problems of the CRT. Nowadays, LCD devices are used in almost all information processing systems which need display devices.

In the meantime, one driving principle of the LCD device is the optical anisotropy and the polarization property of its liquid crystal material. Since the liquid crystal material is thin and long in its structure, its molecular alignment direction can be adjusted depending on the electric field applied to a liquid crystal material having a particular orientation and polarization.

Therefore, by arbitrarily adjusting the alignment direction, light can be transmitted or blocked dependent on the alignment direction of the liquid crystal molecules by the optical anisotropy of the liquid crystal material so as to display colors and images.

Typically, the LCD device includes a first substrate (thin film transistor substrate) and a second substrate (color filter substrate), which are separated and arranged to face each other.

One exemplary description of a fabrication process of the first substrate of the LCD device will be as follows.

First, a metal layer is deposited on a transparent glass substrate, and a first mask process is performed to form a gate bus line and a gate electrode by etching. Then, by depositing a gate insulating layer, an amorphous silicon layer, and a doped amorphous silicon layer in sequence, a second mask process is performed to form a channel layer.

Then, a third mask process is performed by depositing a source/drain metal layer on the substrate having the channel layer formed thereon, and then, by etching to form a source/drain electrode and a data bus line. Further, a protection layer to protect device elements is deposited, and a fourth mask process is performed to form contact holes. Then, an ITO transparent metal layer is deposited on the substrate having the protection layer formed thereon, and by etching, a fifth mask process is performed to form a pixel electrode.

As described above, a patterning process is performed by depositing or coating a metal layer and an insulating layer on the transparent glass substrate alternately. In the case of a metal layer, the metal layer is etched by wet etching, and in the case of an insulating layer, dry etching is used by using plasma molecules.

In etching processes, the conditions of pressure and ion molecular concentration of plasma in the etching chamber are controlled dependent on the etched subjects.

Further, a black matrix in a lattice shape is formed on the transparent upper substrate of the color filter substrate. Then, color filter layers of red (R), green (G), blue (B) are formed on the black matrix to complete the color filter substrate.

Further, in the formation of the black matrix, a metal layer such as chrome is formed on the substrate by using vacuum deposition, for example, and a photosensitive resin is formed thereon. Then, patterning is performed by using photolithography and the chrome is subsequently etched.

As such, a wet etching process is included in the fabrication of the thin film transistor substrate and the color filter substrate. Such a wet etching process is classified into PSL (poly spacer LOCOS) or STI (shallow trench isolation) structure of active define process and via round etching process or the like. The etchant used in the wet etching process can be roughly classified into two component group and three component group compounds.

The two component group compound includes HF and deionized water (DIW) in which the HF dissolved in the DIW is dissociated into a small amount of $HF_2$ to etch an oxide layer. The three component group compound is called SBOE (surfactant buffered oxide etchant), and is composed of HF, $NH_4F$, DIW, and negative ion surfactants. In such an SBOE group etchant, all HF in the DIW is dissociated into $HF_2$ by the added $NH_4F$.

In the fabrication process of an LCD device, compounds such as those above are mixed and used as the etchant. The structure of the etchant supply apparatus employed in a typical etching system is illustrated in FIG. 1. FIG. 1 is a schematic representation of an etchant supply apparatus in a typical etching system.

As shown in FIG. 1, an etchant supply apparatus 100 includes a first etchant tank 110a and a second etchant tank 110b, which contain the etchant compound described above. The etchant supply apparatus 100 also includes a pump 150 for supplying the etchant from the first etchant tank 110a and the second etchant tank 110b to a supply pipe 130.

Further, etchant fume exhaust units 120a, 120b are provided in the upper portion of the etchant supply apparatus 100, for discharging a gas state of the etchant out of the etching system. Further, after the etching process is completed, a return line 140 is provided such that the etchant used in the etching process can be returned into the first etchant tank 110a and the second etchant tank 110b.

Though not shown in the drawing, the etchant supply apparatus 100 further includes a self-circulation unit and a filter unit for filtering the returned etchant and a coolant supply part, for example.

Describing in more detail, the etchant supply apparatus 100 structured as above mixes the etchant compound contained in the first etchant tank 110a and the second etchant tank 110b by the movement of the pump 150, and supplies the mixed etchant to a chamber (not shown) being used for the etching process. Then, when the etching process is performed in the fabrication of a thin film transistor substrate and a color filter substrate of an LCD device, the etchant supply apparatus 100 supplies the mixed etchant to the substrate for which the etching is processed.

After the etching process is done, the etchant used in the etching process passes through the return line 140 of the etchant supply apparatus 100 and comes back into the first etchant tank 110a and the second etchant tank 110b. Further, when another etching process is performed for the substrate, the etchant supply apparatus 100 supplies etchant to the chamber by the movement of the pump 150.

In the etchant supply apparatus 100 of the etching system, the supply of etchant to the chamber, and the return of the etchant from the chamber are all repeatedly performed. During the repetitive supply and return of the etchant described as above, the etchant, being very volatile, becomes gaseous and rises up over the etchant supply apparatus 100. Thus, etchant fume exhaust units 120a, 120b are provided in the upper portion of the etchant supply apparatus 100 for discharging the gas state of etchant out of the system.

FIG. 2 is an exemplary conceptional representation of the structure of the etchant fume exhaust apparatus installed in a conventional etching system.

As shown in FIG. 2, an exhaust hole 200 is provided in the etchant exhaust apparatus. The etchant hole 200 is located in the upper portion of the etchant supply apparatus, and is configured to penetrate the apparatus 100 so that the gas state of etchant, which has risen upward, is discharged out of the apparatus 100 through the exhaust hole 200.

While the gas state of the etchant is being discharged through the exhaust hole 200, the rising etchant often re-liquefies in the exhaust hole 200. This re-liquefied etchant returns back into the apparatus 100 from the exhaust hole 200, and the dripping etchant falls down on the etching system. This causes problems in contamination and corrosion of the etching equipment in the apparatus 100.

SUMMARY OF THE INVENTION

Accordingly, one embodiment of the present invention is directed to an etchant fume exhaust apparatus that substantially obviates one or more problems caused by the limitations and disadvantages of the related art.

One embodiment of the present invention provides an etchant fume exhaust apparatus that prevents the contamination and corrosion of an etching system due to vaporized or liquefied etchant that is used for wet etching processes during the fabrication of an LCD device by completely discharging the etchant.

Additional advantages and features of the invention will be set forth in part in the description which follows and in part will become apparent to those having ordinary skill in the art upon examination of the following or may be learned from practice of the invention. The advantages of the invention may be realized and attained by the structure particularly pointed out in the written description and claims hereof as well as the appended drawings.

To achieve these and other advantages and in accordance with the invention, as embodied and broadly described herein, in one embodiment the etchant fume exhaust apparatus is installed inside an etching system and discharges gaseous etchant generated in the etching system. The etchant fume exhaust apparatus comprises an exhaust hole that provides a passage to discharge of the gaseous etchant, an exhaust plate disposed to collect liquefied etchant from the exhaust hole, a support part that connects the exhaust plate and the exhaust hole, and an exhaust line connected to the exhaust plate through which the liquefied etchant collected in the exhaust plate is removed from the exhaust plate. The exhaust hole may have a hollow cylindrical shape.

An upper surface of the exhaust plate may be formed such that a width of an opening formed by a first end of the upper surface most proximate to the exhaust hole is larger than a width of an opening formed by a second end of the upper surface most distal from the exhaust hole. In this case, a slope of the upper surface of the exhaust plate may be constant between the first and second ends of the upper surface.

A space between the exhaust hole and the exhaust plate may be used to provide a route through which the gaseous etchant generated in the etching system is induced into the exhaust hole.

The support part may be formed in a substantially frustoconical shape in which a width of the support part most proximate to the exhaust hole is smaller than a width of the support part most distal from the exhaust hole.

The exhaust line may be disposed such that liquefied etchant in the exhaust line is removed from the exhaust apparatus or reused the etching system.

In another aspect of the present invention, an etching system comprises an etchant supply apparatus that supplies etchant, a chamber in which etching is performed using the etchant supplied from the etchant supply apparatus, and an etchant fume exhaust apparatus disposed in an upper portion of the etchant supply apparatus. The etchant fume exhaust apparatus comprises an exhaust hole that provides a passage to discharge gaseous etchant, an exhaust plate disposed to collect the gaseous etchant that has condensed into a liquefied etchant and is dripping from the exhaust hole, a support part that connects the exhaust plate and the exhaust hole, and an exhaust line connected to the exhaust plate and removes the liquefied etchant collected in the exhaust plate.

Similar to the above apparatus, the exhaust hole may have a hollow cylindrical shape. An upper surface of the exhaust plate may be formed such that a width of an opening formed by a first end of the upper surface most proximate to the exhaust hole is larger than a width of an opening formed by a second end of the upper surface most distal from the exhaust hole. In this case, a slope of the upper surface of the exhaust plate may be constant between the first and second ends of the upper surface. A space between the exhaust hole and the exhaust plate may be used to provide a route through which the gaseous etchant generated in the etching system is induced into the exhaust hole. The support part may be formed in a substantially frustoconical shape in which a width of the support part most proximate to the exhaust hole is smaller than a width of the support part most distal from the exhaust hole. The exhaust line may be disposed such that liquefied etchant in the exhaust line is removed from the exhaust apparatus or reused the etching system.

Another embodiment is a method of decreasing contact between condensed etchant in an etchant fume exhaust apparatus and equipment in an etching system. This method comprises providing a passage through which gaseous etchant generated in the etching system is discharged and in which the gaseous etchant condenses into the condensed etchant and collecting the condensed etchant escaping from the passage in a collection site prior to contact occurring between the condensed etchant and the equipment, thereby inhibiting the condensed etchant from contacting the equipment.

The method may further comprise removing the condensed etchant from the collection site. The method may further comprise removing the collected condensed etchant from the exhaust apparatus or reusing the collected condensed etchant in the etching system. The method may further comprise inducing the gaseous etchant into a space between the passage and the collection site.

The method may further comprise tapering an inner surface of the collection site such that condensed etchant that rebounds after striking the inner surface is directed at an oblique angle with respect to the condensed etchant striking the inner surface and may additionally comprise tapering a majority of the inner surface such that the majority of the inner surface has a constant slope.

The method may further comprise intercepting at least a portion of the condensed etchant from the passage traveling towards the collection site before the condensed etchant contacts the collection site. In this case, the amount of the intercepted condensed etchant may be increased by tapering an interceptor that intercepts the portion of the condensed etchant such that the interceptor widens with increasing distance from the passage.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate an embodiment of the invention and together with the description serve to explain the principle of the invention. In the drawings.

DETAILED DESCRIPTION OF THE INVENTION

Reference will now be made in detail to the embodiments of the present invention, examples of which are illustrated in the accompanying drawings.

Figure 1:
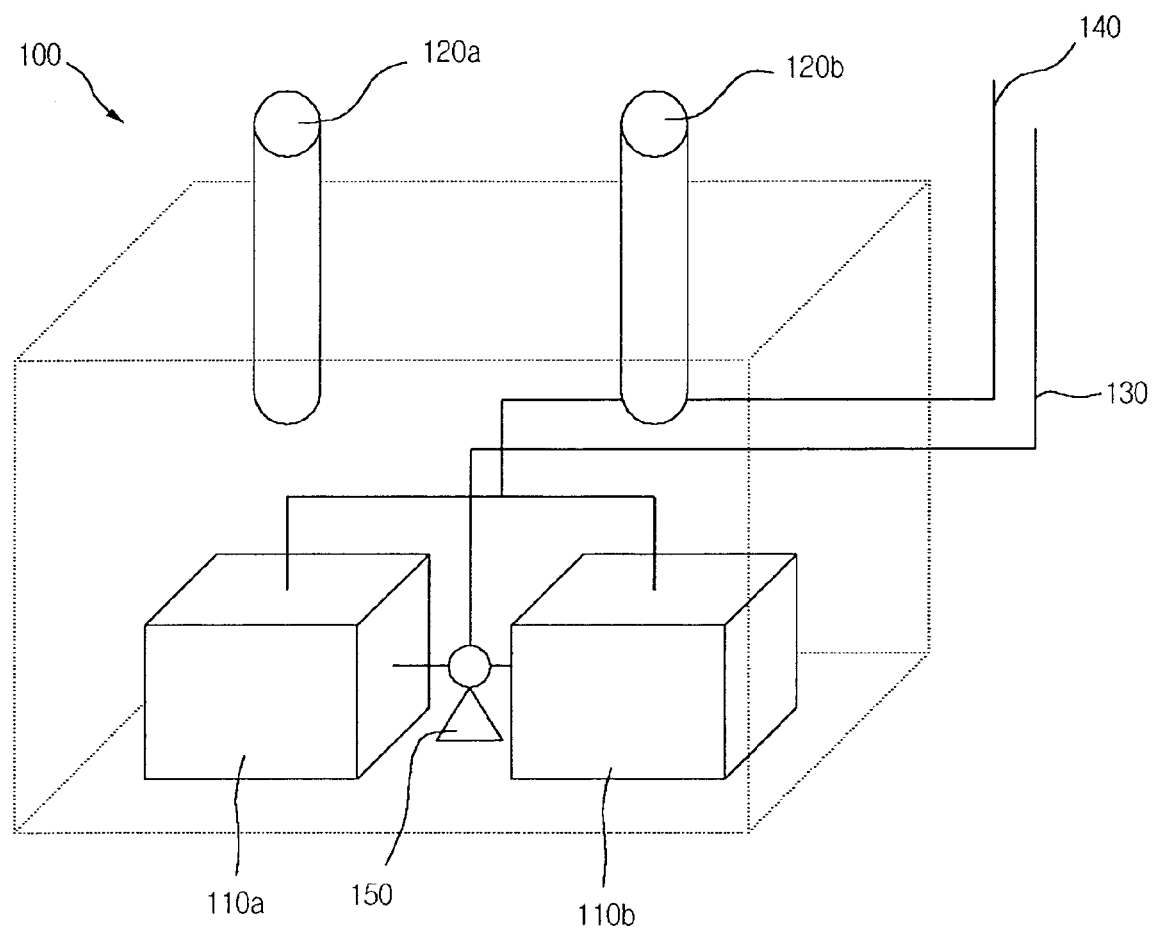
FIG. 1 is a schematic representation of an etchant supply apparatus in a conventional etching system.
Figure 2:
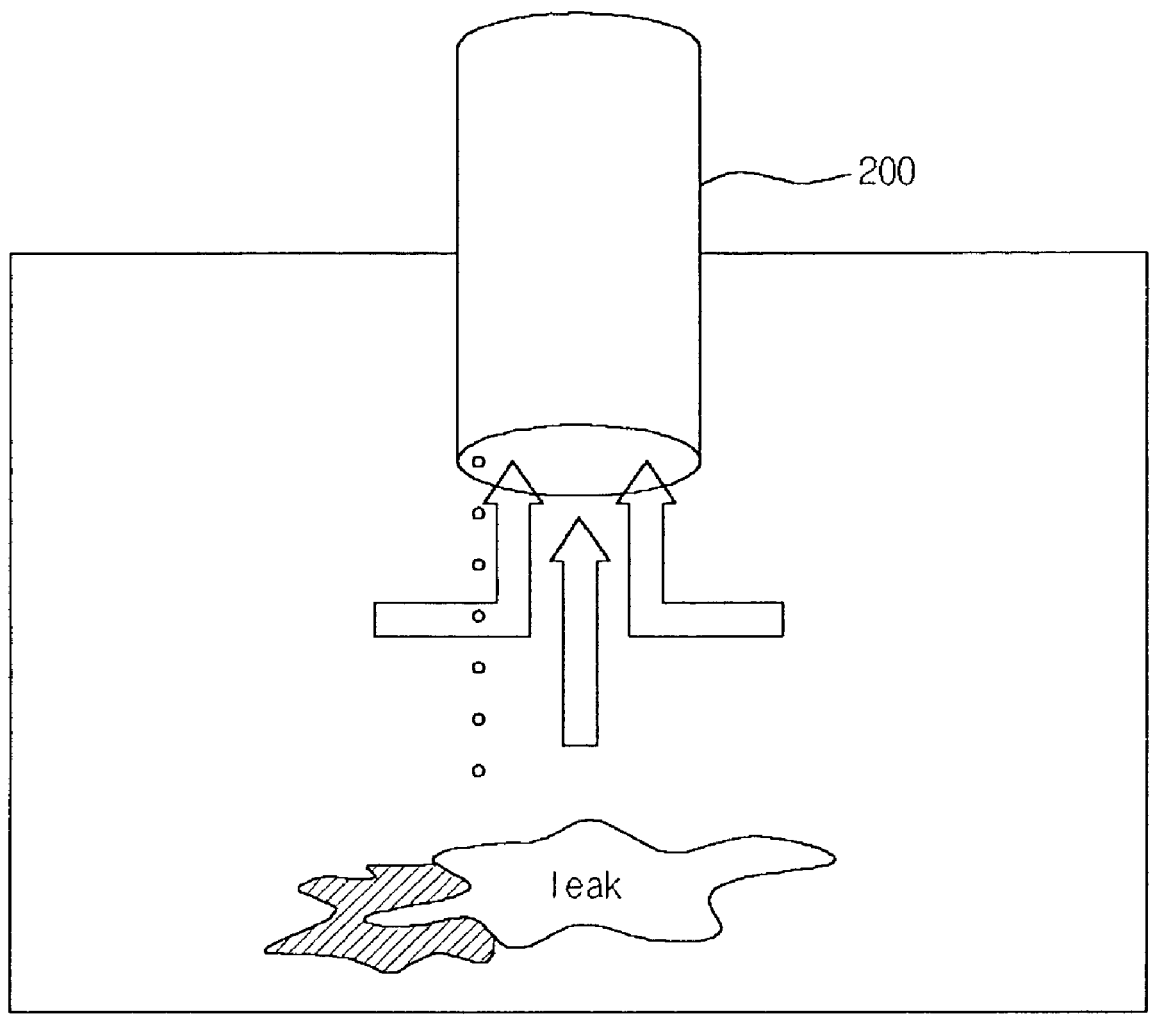
FIG. 2 is an exemplary conceptional representation of the structure of an etchant fume exhaust apparatus installed in a conventional etching system.

The structure of the etchant supply apparatus installed in a typical etching system is similar that of FIG. 1. FIG. 1 schematically illustrates an etchant supply apparatus in a typical etching system.

The explanation of the typical etching system depicted in FIG. 1 is similar to the description of the related art, and so, reference to the related art will be made briefly hereinafter.

The etchant supply apparatus 100 as shown in FIG. 1 mixes etching compound contained in the first etchant tank 110a and the second etchant tank 110b by the movement of the pump 150, and supplies the mixed etchant to the chamber where an etching process is performed. When etching is performed during the fabrication of a thin film transistor substrate and a color filter substrate of an LCD device, the etchant supply apparatus 100 supplies the mixed etchant to the substrate for which the etching is processed.

After the etching process is performed, the etchant used in the etching process passes through the return line 140 of the etchant supply apparatus 100 and comes back into the first etchant tank 110a and the second etchant tank 110b. Further, when another etching process is performed for the substrate, the etchant supply apparatus 100 supplies etchant to the chamber by the movement of the pump 150. Though not shown in the drawing, the etchant supply apparatus 100 further includes a self-circulation unit and a filter unit for filtering the returned etchant and a coolant supply part.

In the etchant supply apparatus 100 of the etching system, the supply of etchant to the chamber, and the return of the etchant from the chamber are all repeatedly performed. During the repetitive supply and return of the etchant described as above, the etchant, being very volatile, enters a gaseous state and rises over the etchant supply apparatus 100. Thus, etchant fume exhaust units 120a, 120b for discharging the gas state of etchant out of the system are provided in the upper portion of the etchant supply apparatus 100.

Figure 3:
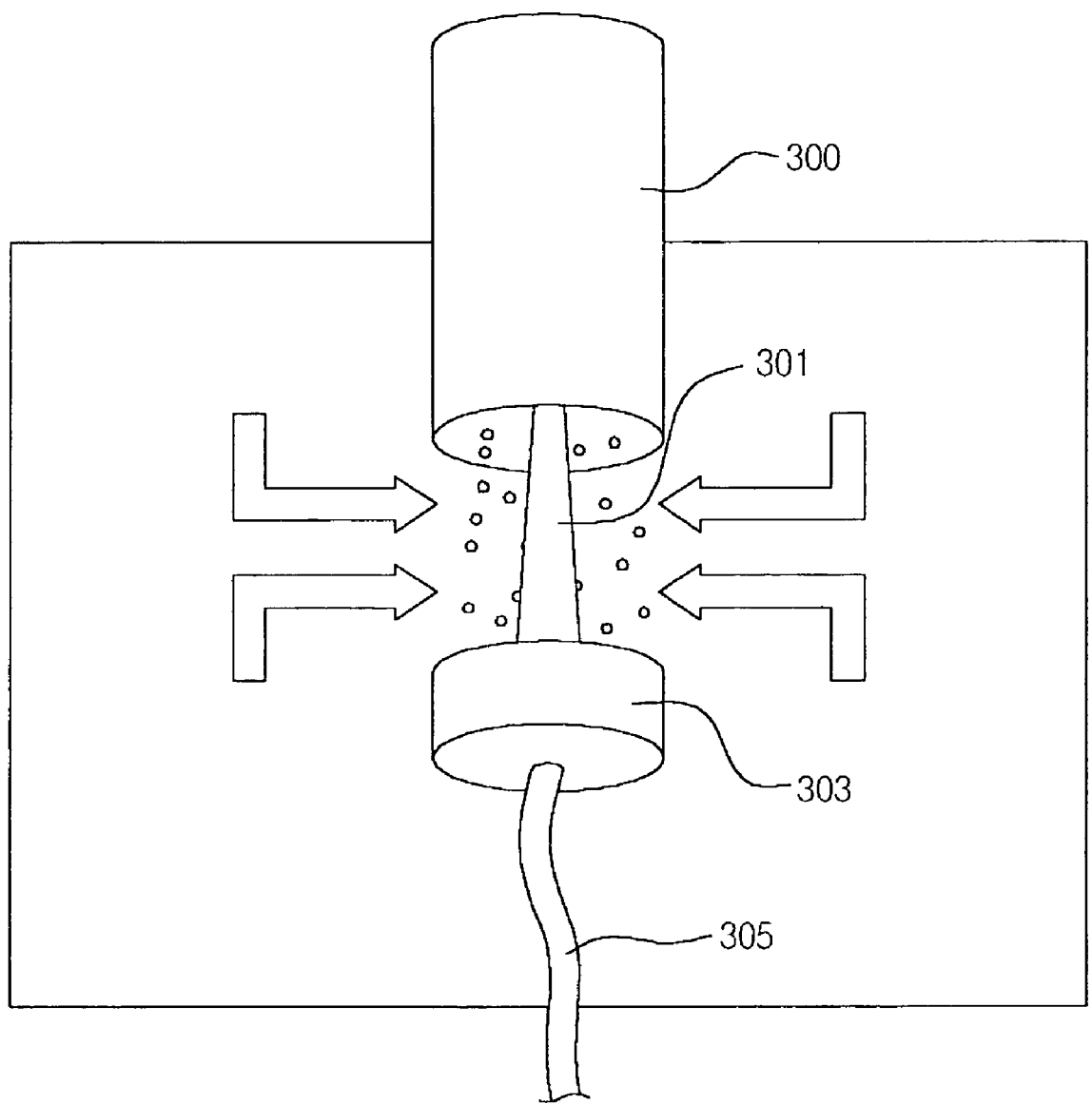
FIG. 3 is an exemplary conceptional representation of the structure of an etchant fume exhaust apparatus installed in an etching system according to an embodiment of the present invention.

Now, an etchant fume exhaust apparatus of the present invention will be described in reference to FIG. 3. FIG. 3 is an exemplary conceptional representation of the structure of the etchant fume exhaust apparatus installed in the etching system according to the present invention.

As shown in FIG. 3, the etchant fume exhaust apparatus of present invention includes an exhaust hole 300, a support part 301, an exhaust plate 303, and an exhaust line 305. Herein after, each component element will be explained in detail.

The exhaust hole 300 with a cylindrical shape is provided in the upper portion of the etchant supply apparatus 100 such that a gaseous state of etchant is introduced thereinto and discharged out of the apparatus 100. Further, a passage is provided inside the exhaust hole 300 that is substantially perpendicular to the material through which the exhaust hole 300 passes to enable the gas to pass therethrough.

The exhaust plate 303 is provided under the cylindrical-shaped exhaust hole 300. Thus, the gaseous state of the etchant existing in the upper portion of the etchant supply apparatus 100 is induced into the space between the exhaust hole 300 and the exhaust plate 303.

The exhaust plate 303 is disposed to receive the etchant falling from the exhaust hole 300 that has condensed due to the temperature drop when the gaseous etchant is being discharged out of the apparatus 100 through the exhaust hole 300. As shown, the top of the exhaust plate 303 is at least as wide as the exhaust hole 300 (and may be wider than the exhaust hole 300) to collect substantially all of the condensed (or re-liquified) etchant from the exhaust hole 300.

Further, the center of the exhaust plate 303 is connected to one end of the support part 301 and the other end of the support part 301 (not shown) is fixed to the inside of the exhaust hole 300 in a manner that does not substantially impede flow of the gaseous etchant from the apparatus 100 through the exhaust plate 303 (for example, using one or more struts attached to the end of the support part 301 and the inside of the etchant hole 300). The support part 301, the exhaust plate 303, and the exhaust hole 300, as well as the connectors that connect these together, may be formed from one or more materials that are not corroded appreciably by the etchant. The support part 301, as illustrated, is formed in a substantially frustoconical shape, which tapers towards the exhaust hole 300. Such a shape permits condensed etchant that contacts the support part 301 to adhere to the support part 301 due to surface tension and run down towards the exhaust plate 303 along the support part 301. As the condensed etchant runs down the support plate 301, eventually contacting the exhaust plate 303 relatively gently, such re-liquefied etchant does not splatter on the surface of the exhaust plate 303. In addition, as the support part 301 increases in width towards the exhaust plate 303, this increases the amount of condensed etchant contacting the support plate 301 and decreases the possibility of the re-liquefied etchant splattering on the surface of the exhaust plate 303.

Further, an exhaust line 305 that collects the re-liquefied etchant that has dropped onto the exhaust plate from the exhaust hole 300 is connected to the bottom of the exhaust plate 303. The exhaust line 305 may also be formed from one or more materials that are not corroded appreciably by the etchant.

Figure 4A:
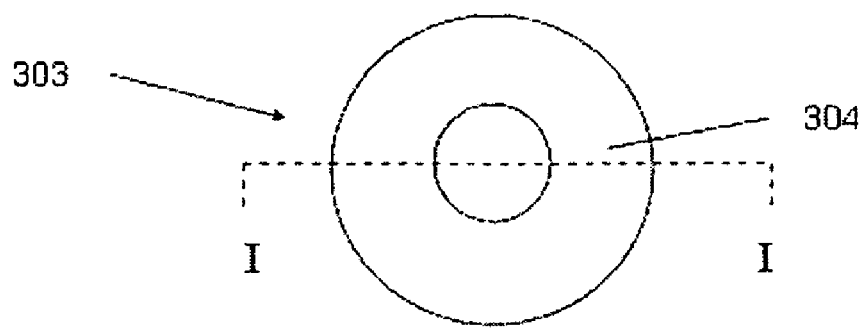
FIGS. 4(a) and 4(b) are top and cross-sectional views of an exhaust plate according to an embodiment of the present invention.
Figure 4B:
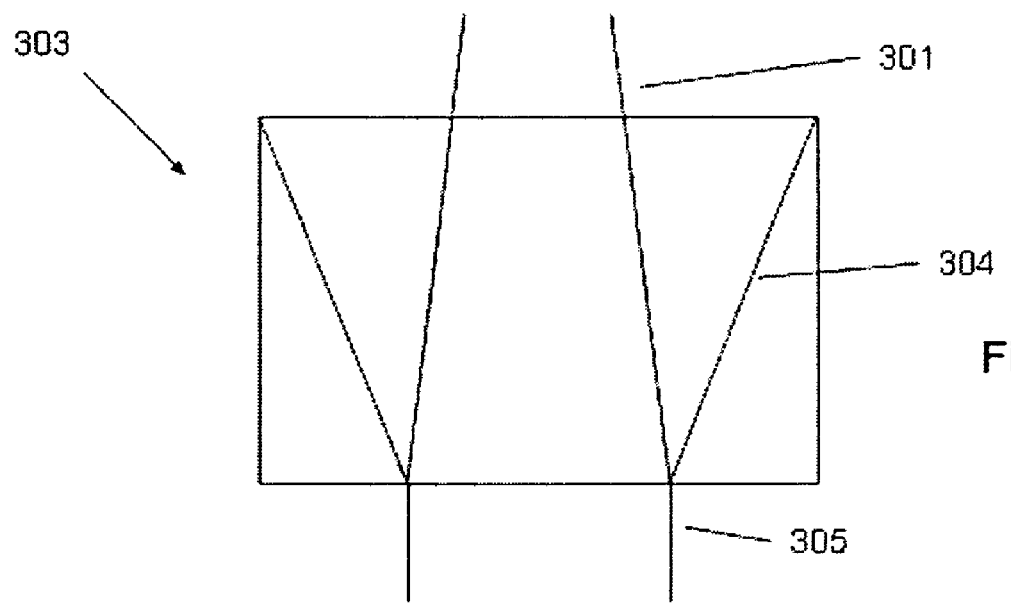

As shown in FIGS. 4(a) and 4(b), the upper surface 304 of the exhaust plate 303 tapers towards the center of the exhaust plate 303. FIGS. 4(a) and 4(b) are top and cross-sectional views of the exhaust plate 303 along the line I-I. As shown, the upper surface of the exhaust plate 303 may be tilted with a constant slope towards the end of the exhaust plate 303 most proximate to the underlying equipment, although this slope need not be constant so long as the condensed etchant received by the upper surface 304 is collected and transported via the exhaust line 305 without overflow. Thus, the exhaust plate 303 may be formed in a substantially cylindrical shape with the inner surface 304 being formed in a substantially frustoconical shape.

The exhaust plate 303 itself may also be formed in a substantially frustoconical shape. One advantage of such a shape is that, as discussed above, condensed etchant may splatter on the upper surface 304 of the exhaust plate 303. If the re-liquefied etchant falls from a great enough height onto the upper surface 304, it may rebound over the edge of the exhaust plate 303 and fall on the underlying equipment, thereby causing corrosion and contamination of the equipment. When the upper surface 304 is tapered, however, not only does the re-liquefied etchant trickle down into the exhaust line 305, but the re-liquefied etchant that rebounds must travel further before clearing the edge of the exhaust plate 303. This increases the probability of the rebounding etchant contacting the upper surface 304 and consequently decreases the possibility of the rebounding etchant falling on the underlying equipment.

Therefore, the liquefied etchant dripping from the exhaust hole 300 enters the exhaust plate 303, and is collected at the center of the exhaust plate 303. Then, the etchant collected at the center of the exhaust plate 303 is discharged out of the apparatus 100 through the exhaust line 305 as a passage of the etchant toward the bottom of the apparatus 100. In another embodiment, the etching system can be structured such that the returned etchant can be reused by a reprocessing, rather than being discharged out of the system.

As described above, according to the etchant fume exhaust apparatus of the present invention, the condensed etchant in the exhaust hole is prevented from contacting the equipment underlying the exhaust hole while the etchant remaining in the gaseous state is still discharged out of the apparatus. That is, since the liquefied etchant is collected into the exhaust plate and is reused or discharged out of the apparatus, the contamination and corrosion of the etching system can be prevented.

It will be apparent to those skilled in the art that various modifications and variations can be made in the present invention. For example, a pressure differential such as a vacuum can be applied to the exhaust hole to aid in removing the etchant. Thus, it is intended that the present invention covers the modifications and variations of this invention provided they come within the scope of the appended claims and their equivalents.

What is claimed is:

1. An etchant fume exhaust apparatus installed inside an etching system, the etching system including an etchant supply apparatus, wherein the etchant fume exhaust apparatus comprises:
   an exhaust hole that provides a passage to discharge gaseous etchant generated from the etchant supply apparatus in the etching system;
   an exhaust plate disposed to collect liquefied etchant from the exhaust hole and disposed under the bottom surface of the exhaust hole;
   a support part that fixes the exhaust plate to the exhaust hole and extends into the inside of the exhaust hole, the exhaust plate suspended from the exhaust hole by the support part, the support part disposed such that substantially all of an entire outer surface of the support part is exposed to the gaseous etchant; and
   an exhaust line connected with the exhaust plate and through which the liquefied etchant in the exhaust plate is removed from the exhaust plate,
   wherein a width of an opening formed by a first end of an upper surface of the exhaust plate most proximate to the exhaust hole is larger than a width of the support part most distal from the exhaust hole.

2. The etchant fume exhaust apparatus of claim 1, wherein the exhaust hole has a hollow cylindrical shape.

3. The etchant fume exhaust apparatus of claim 1, wherein the upper surface of the exhaust plate is formed such that the width of the opening formed by the first end of the upper surface most proximate to the exhaust hole is larger than a width of an opening formed by a second end of the upper surface most distal from the exhaust hole.

4. The etchant fume exhaust apparatus of claim 3, wherein a slope of the upper surface of the exhaust plate is constant between the first and second ends of the upper surface.

5. The etchant fume exhaust apparatus of claim 1, wherein a space between the exhaust hole and the exhaust plate provides a route through which the gaseous etchant generated in the etching system is induced into the exhaust hole.

6. The etchant fume exhaust apparatus of claim 1, wherein the support part is formed in a substantially frustoconical shape in which a width of the support part most proximate to the exhaust hole is smaller than the width of the support part most distal from the exhaust hole.

7. The etchant fume exhaust apparatus of claim 1, wherein the exhaust line is disposed such that liquefied etchant in the exhaust line is removed from the exhaust apparatus.

8. The etchant fume exhaust apparatus of claim 1, wherein the exhaust line is disposed such that liquefied etchant in the exhaust line is reused in the etching system.

9. The etchant fume exhaust apparatus of claim 1, wherein the support part, the exhaust plate, and the exhaust hole are formed from material that resists corrosion by the etchant.

10. An etching system comprising:
    an etchant supply apparatus that supplies etchant;
    an etchant fume exhaust apparatus disposed in an upper portion of the etchant supply apparatus, the etchant fume exhaust apparatus comprising an exhaust hole that provides a passage to discharge gaseous etchant, an exhaust plate disposed under the bottom surface of the exhaust hole and disposed to collect the gaseous etchant that has condensed into a liquefied etchant and that is dripping from the exhaust hole, a support part that fixes the exhaust plate to the exhaust hole and extends into the inside of the exhaust hole, the exhaust plate suspended from the exhaust hole by the support part, and an exhaust line connected to the exhaust plate and removes the liquefied etchant collected in the exhaust plate, wherein a width of an opening formed by a first end of an upper surface of the exhaust plate most proximate to the exhaust hole is larger than a width of the support part most distal from the exhaust hole; and a chamber in which etching occurs using the etchant supplied from the etchant supply apparatus.

11. The etching system of claim 10, wherein the exhaust hole has a hollow cylindrical shape.

12. The etching system of claim 10, wherein the upper surface of the exhaust plate is formed such that the width of the opening formed by the first end of the upper surface most proximate to the exhaust hole is larger than a width of an opening formed by a second end of the upper surface most distal from the exhaust hole.

13. The etching system of claim 12, wherein a slope of the upper surface of the exhaust plate is constant between the first and second ends of the upper surface.

14. The etching system of claim 10, wherein a space between the exhaust hole and the exhaust plate provides a route through which the gaseous etchant generated in the etching system is induced into the exhaust hole.

15. The etching system of claim 10, wherein the support part is formed in a substantially frustoconical shape in which a width of the support part most proximate to the exhaust hole is smaller than the width of the support part most distal from the exhaust hole.

16. The etching system of claim 10, wherein the exhaust line is disposed such that the liquefied etchant in the exhaust line is removed from the exhaust apparatus.

17. The etching system of claim 10, wherein the exhaust line is disposed such that the liquefied etchant in the exhaust line is reused in the etching system.

18. The etching system of claim 10, wherein the support part, the exhaust plate, and the exhaust hole are formed from material that resists corrosion by the etchant.

19. The etching system of claim 10, wherein the support part is disposed such that substantially all of an entire outer surface of the support part is exposed to the etchant.

20. The etching system of claim 10, wherein the support part contacts the upper surface of the exhaust plate.

21. An etchant fume exhaust apparatus installed inside an etching system, the etchant fume exhaust apparatus comprising:

an exhaust hole that provides a passage to discharge gaseous etchant generated in the etching system by an etchant supply tank;

an exhaust plate disposed to collect liquefied etchant from the exhaust hole and disposed under the bottom surface of the exhaust hole;

a support part that fixes the exhaust plate to the exhaust hole and contacts an upper surface of the exhaust plate wherein the upper surface is tapered and extends into the inside of the exhaust hole, the exhaust plate suspended from the exhaust hole by the support part; and an exhaust line connected with the exhaust plate and through which the liquefied etchant in the exhaust plate is removed from the exhaust plate, wherein a width of an opening formed by a first end of the upper surface of the exhaust plate most proximate to the exhaust hole is larger than a width of the support part most distal from the exhaust hole.

22. The etchant fume exhaust apparatus of claim 21, wherein the support part, the exhaust plate, and the exhaust hole are formed from material that resists corrosion by the etchant.

23. The etchant fume exhaust apparatus of claim 21, wherein the support part increases in width of the support part towards the exhaust plate.

24. The etchant fume exhaust apparatus of claim 23, wherein the support part tapers continuously along the entire length of the support part.

25. The etchant fume exhaust apparatus of claim 21, wherein the upper surface of the exhaust plate tapers towards a center of the exhaust plate.

26. The etchant fume exhaust apparatus of claim 25, wherein the upper surface of the exhaust plate tapers continuously along the entire length of the upper surface.

27. The etchant fume exhaust apparatus of claim 21, wherein the support part is disposed such that substantially all of an entire outer surface of the support part is exposed to the etchant.

* * * * *